United States Patent
Deng et al.

(10) Patent No.: US 9,208,832 B2
(45) Date of Patent: Dec. 8, 2015

(54) FUNCTIONAL SCREENING OF STATIC RANDOM ACCESS MEMORIES USING AN ARRAY BIAS VOLTAGE

(71) Applicant: Texas Instruments Incorporated, Dallas, TX (US)

(72) Inventors: Xiaowei Deng, Plano, TX (US); Yang Yi, Allen, TX (US); Wah Kit Loh, Richardson, TX (US)

(73) Assignee: TEXAS INSTURMENTS INCORPORATED, Dallas, TX (US)

( * ) Notice: Subject to any disclaimer, the term of this patent is extended or adjusted under 35 U.S.C. 154(b) by 141 days.

(21) Appl. No.: 13/723,639

(22) Filed: Dec. 21, 2012

(65) Prior Publication Data

US 2013/0176772 A1     Jul. 11, 2013

Related U.S. Application Data

(60) Provisional application No. 61/584,028, filed on Jan. 6, 2012.

(51) Int. Cl.
| | |
|---|---|
| *G11C 5/14* | (2006.01) |
| *G11C 29/50* | (2006.01) |
| *G11C 29/02* | (2006.01) |
| *G11C 29/12* | (2006.01) |
| *G11C 29/26* | (2006.01) |
| *G11C 11/41* | (2006.01) |
| *G11C 29/40* | (2006.01) |
| *G11C 29/04* | (2006.01) |

(52) U.S. Cl.
CPC .............. G11C 5/147 (2013.01); G11C 29/021 (2013.01); G11C 29/1201 (2013.01); G11C 29/12005 (2013.01); G11C 29/26 (2013.01); G11C 29/50004 (2013.01); *G11C 11/41* (2013.01); *G11C 29/40* (2013.01); *G11C 2029/0401* (2013.01)

(58) Field of Classification Search
CPC ................. H01L 2224/73204; H01L 2224/97; H01L 2224/81; H01L 2224/11; H01L 2225/06596; H01R 2201/20; H05K 1/0213; G11C 5/147; H02H 3/207
USPC ............. 324/149, 763; 714/719, 723; 327/50, 327/73, 538, 543; 365/154, 189.02
See application file for complete search history.

(56) References Cited

U.S. PATENT DOCUMENTS

| | | | |
|---|---|---|---|
| 5,672,997 A * | 9/1997 | Shield | 327/538 |
| 2008/0238407 A1* | 10/2008 | Grassi et al. | 324/149 |
| 2010/0246297 A1* | 9/2010 | Zhang et al. | 365/200 |
| 2012/0131399 A1* | 5/2012 | Henrion et al. | 714/723 |
| 2012/0173937 A1* | 7/2012 | Do et al. | 714/719 |

\* cited by examiner

*Primary Examiner* — J. H. Hur
*Assistant Examiner* — Ajay Ojha
(74) *Attorney, Agent, or Firm* — Rose Alyssa Keagy; Frank D. Cimino

(57) ABSTRACT

A method of testing large-scale integrated circuits including multiple instances of memory arrays, and an integrated circuit structure for assisting such testing. In one embodiment, voltage drops due to parasitic resistance in array bias conductors are determined by extracting layout parameters, and subsequent circuit simulation that derives the voltage drops in those conductors during operation of each memory array. In another embodiment, sense lines from each memory array are selectively connected to a test sense terminal of the integrated circuit, at which the array bias voltage at each memory array is externally measured. Feedback control of the applied voltage to arrive at the desired array bias voltage can be performed.

17 Claims, 7 Drawing Sheets

FUNCTIONAL SCREENING OF STATIC RANDOM ACCESS MEMORIES USING AN ARRAY BIAS VOLTAGE

CROSS-REFERENCE TO RELATED APPLICATIONS

This application claims priority, under 35 U.S.C. §119(e), of Provisional Application No. 61/584,028, filed Jan. 6, 2012 and is incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to the manufacture and testing of embedded static random access memories (SRAMs) in large-scale integrated circuits.

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

An example of a conventional SRAM cell is shown in FIG. 1. In this example, SRAM cell 2 is a conventional six-transistor (6-T) static memory cell 2, which in this case is in the $j^{th}$ row and $k^{th}$ column of a memory array. SRAM memory cell 2 is biased between the voltage on power supply line $V_{dda}$ and a ground reference voltage $V_{ssa}$. SRAM memory cell 2 is constructed in the conventional manner as a pair of cross-coupled CMOS inverters, one inverter of series-connected p-channel load transistor 3a and n-channel driver transistor 4a, and the other inverter of series-connected p-channel load transistor 3b and n-channel transistor 4b; the gates of the transistors in each inverter are connected together and to the common drain node of the transistors in the other inverter, in the usual manner. The common drain node of transistors 3a, 4a constitutes storage node SNT, and the common drain node of transistors 3b, 4b constitutes storage node SNB, in this example. N-channel pass-gate transistor 5a has its source/drain path connected between storage node SNT and bit line $BLT_k$ for the $k^{th}$ column, and n-channel pass-gate transistor 5b has its source/drain path connected between storage node SNB and bit line $BLB_k$. The gates of pass-gate transistors 5a, 5b are driven by word line $WL_j$ for this $j^{th}$ row in which cell 2 resides.

In operation, bit lines $BLT_k$, $BLB_k$ are typically precharged to a high voltage (at or near power supply voltage $V_{dda}$), and are equalized to the same voltage. To access cell 2 for a read operation, word line $WL_j$ is then energized, turning on pass-gate transistors 5a, 5b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

As mentioned above, device variability can cause read and write failures, particularly in memory cells constructed with sub-micron minimum feature size transistors. A write failure occurs when an addressed SRAM cell does not change its stored state when written with the opposite data state. Typically, this failure has been observed to be due to the inability of write circuitry to pull down the storage node currently latched to a high voltage. For example, in an attempt to write a low logic level to storage node SNT of cell 2 of FIG. 1, if bit line $BLT_k$ is unable to sufficiently discharge storage node SNT to a sufficient level to trip the inverters, cell 2 may not latch to the desired data state.

Cell stability failures are the converse of write failures—while a write failure occurs if a cell is too stubborn in changing its state, a cell stability failure occurs if a cell changes its state too easily. Noise of sufficient magnitude coupling to the bit lines of unselected cells, for example during a write to a selected memory cell in the same row, can cause a false write of data to unselected cells in that same row. In effect, such write cycle noise can be of sufficient magnitude as to trip the inverters of one or more of the unselected cells (i.e., the "half-selected" cells in unselected columns of the selected row). The possibility of such stability failure is exacerbated by device mismatch and variability, as discussed above.

As known in the art, an important measure of the functionality of an SRAM memory cell is the minimum power supply voltage (i.e., the differential voltage between array power supply voltage $V_{dda}$ and array reference voltage $V_{ssa}$ in the arrangement of FIG. 1) at which that memory cell can be successfully written and read. It is desirable that this minimum power supply voltage be as low as possible, particularly for memories to be implemented in portable and other battery-powered or otherwise power-sensitive applications. This minimum power supply voltage is referred to in the art as "Vmin".

In modern SRAMs constructed with sub-micron feature sizes, the measure of Vmin will vary from cell to cell within an array, and therefore within the same multiple-array or multiple-block integrated circuit. This cell-to-cell variation stems from such known effects as random dopant fluctuation ("RDP"), line-end roughness ("LER"), and the like, which introduce observable variations among populations of transistors in the deep sub-micron regime. As a result, the Vmin for a particular memory will be determined by the cell within that memory with the poorest (i.e., highest) Vmin measurement.

Furthermore, it has been observed that Vmin tends to degrade over operating life in conventional CMOS SRAMs. Important mechanisms in this regard include negative bias temperature instability ("NBTI"), which appears as an increase in threshold voltage of p-channel MOS transistors over operating time, and "Random Telegraph Noise" ("RTN") caused by physical defects within MOS gate dielectric that can trap charge during device operation, and thus modulate the threshold voltage of the transistor. These and other mechanisms can cause variations in transistor threshold voltage of as much as 10 to 20 mV, which noticeably affects transistor performance, and adversely affects memory cell Vmin.

Conventional manufacturing test flows for sub-micron CMOS SRAMs now commonly includes a "guardband" voltage to the power supply voltage during one or more functional tests. One or more functional screening tests are performed at this reduced power supply voltage to screen out (or invoke replacement via redundant rows or columns) those devices with a Vmin that is close to the pass/fail threshold at manufacture, within a guardband margin corresponding to the expected NBTI drift over the desired operating life, and perhaps also accounting for expected RTN effects and for other factors.

It is, of course, important to precisely set the power supply voltage at which an SRAM array is functionally tested, especially when testing the SRAM using these guardband voltages for screening out bits or arrays vulnerable to mechanisms such as NBTI or RTN effects. Assuming accurately designed screen conditions, if the test power supply voltage at the SRAM array is actually higher than desired, the SRAM will be "undertested", in that truly vulnerable or failing memory cells will pass the screening test and thus escape into the field; the test yield will be over-estimated as a result. Conversely, if the test power supply voltage at the SRAM array is actually lower than desired, the SRAM will be "overtested" in that some memory cells will be deemed to fail the screen that would not fail the true test, which will reduce the test yield without a noticeable improvement the reliability or functionality of the device in its eventual system usage.

By way of further background, some large-scale integrated circuits, such as the so-called "system-on-a-chip" ("SoC") integrated circuits, include a pad or pin at which a power supply voltage may be applied during test of various functions on that integrated circuit, such functions including memory arrays in such integrated circuits. This pad or pin is connected in parallel to those functions to be tested, such that all receive the same power supply voltage. It is known in the art to apply a fixed adjustment to the power supply voltage applied to such a pad or pin during test, to compensate for resistive voltage drop in the conductors between the pad or pin and the various functions or arrays.

BRIEF SUMMARY OF THE INVENTION

Embodiments of this invention provide a method of applying a precise power supply voltage in the functional testing of each of individual memory resources deployed in a large scale integrated circuit.

Embodiments of this invention provide such a method that does not involve changes to the existing layout of the integrated circuit.

Embodiments of this invention provide such a method and an integrated circuit structure in which the actual power supply voltage applied to each memory resource can be measured.

Embodiments of this invention provide such a method and integrated circuit structure in which real time control of the power supply voltage applied to a memory resource during functional test can be performed.

Other objects and advantages of embodiments of this invention will be apparent to those of ordinary skill in the art having reference to the following specification together with its drawings.

Embodiments of this invention may be implemented into a method of designing and carrying out functional test of individual ones of multiple memory arrays in a large-scale integrated circuit. The integrated circuit includes a test bias terminal at which a power supply voltage for biasing the memory arrays is applied during the memory test. Voltage drops between the test bias terminal and each memory array due to parasitic resistance of the conductor are determined, and the applied array bias voltage at the test bias terminal is adjusted accordingly for each memory array to be tested.

Some embodiments of this invention determine the voltage at the memory array by parametric extraction of physical properties of the bias conductor from the device layout, followed by simulation to determine the individual voltage drops between the test bias terminal and each memory array. The bias voltage applied at the test bias terminal for testing each individual memory array is defined as the sum of a desired array bias voltage at the array and the voltage drop for the array determined from extraction and simulation. These embodiments of the invention can be used in connection with existing integrated circuits.

Some embodiments of this invention determine the voltage at each memory array by measuring the actual array bias voltage at each array, via a voltage sense line for each memory array that is coupled to a test sense terminal. The test sense terminal may be a dedicated terminal of the integrated circuit, or may be have a dual purpose and serve as a input, output, or other function in normal operation. An array select circuit controls a multiplexer to select a selected sense line from each memory array for coupling to the test sense terminal, at which the array bias voltage is externally measureable. The array bias voltage applied to the test bias terminal can be set in response to the measured voltage at the array. In some embodiments of the invention, the sensed voltage at the test sense terminal is fed back to the testing system for real-time control of the array bias voltage at the array during test.

DETAILED DESCRIPTION OF THE INVENTION

This invention will be described in connection with its embodiments, namely as implemented into a large scale integrated circuit in which static random access memory (SRAM) arrays are embedded at various physical locations, as it is contemplated that this invention will be especially beneficial when realized in such an application. However, it is also contemplated that this invention may provide significant benefit when realized in other integrated circuit applications and uses. For example, embodiments of this invention may provide significant benefit when used in connection with dynamic random access memory (DRAM) arrays, electrically erasable programmable read-only memory (EEPROM) arrays, and the like. Accordingly, it is to be understood that the following description is provided by way of example only, and is not intended to limit the true scope of this invention as claimed.

Figure 2:
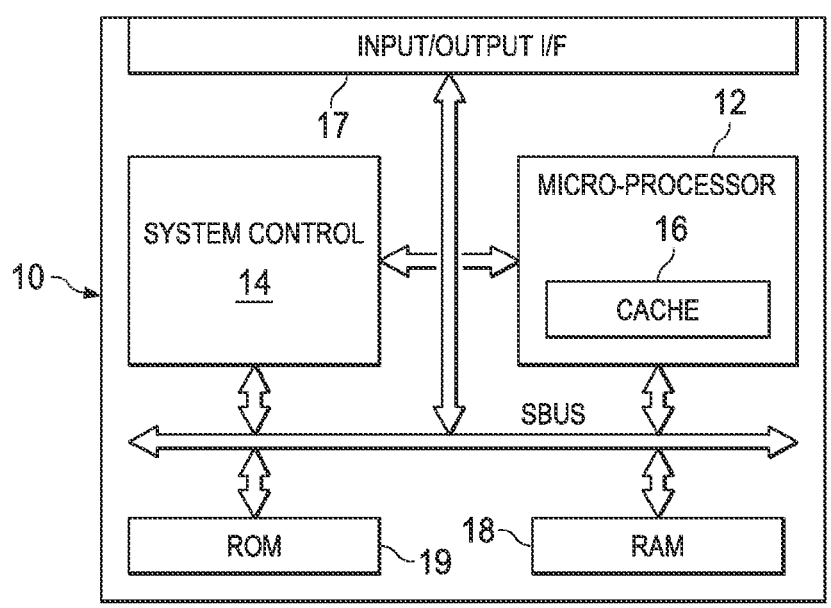
FIG. 2 is an electrical diagram, in block form, of a large scale integrated circuit with embedded memory resources, constructed according to embodiments of this invention.

FIG. 2 illustrates an example of large-scale integrated circuit 10, in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes a central processing unit of microprocessor 12, which is connected to system bus SBUS. Various memory resources, including random access memory (RAM) 18 and read-only memory (ROM) 19, reside on system bus SBUS and are thus accessible to microprocessor 12. Typically, ROM 19 serves as program memory, storing the program instructions executable by microprocessor 12, while RAM 18 serves as data memory; in some cases, program instructions may reside in RAM 18 for recall and execution by microprocessor 12. Cache memory 16 (such as level 1, level 2, and level 3 caches, each typically implemented as SRAM) provides another memory resource, and resides within microprocessor 12 itself and therefore does not require bus access. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 2, or may have its functions arranged according to a different architecture from that shown in FIG. 2. The architecture and functionality of integrated circuit 10 is thus provided only by way of example, and is not intended to limit the scope of this invention.

Figure 3:
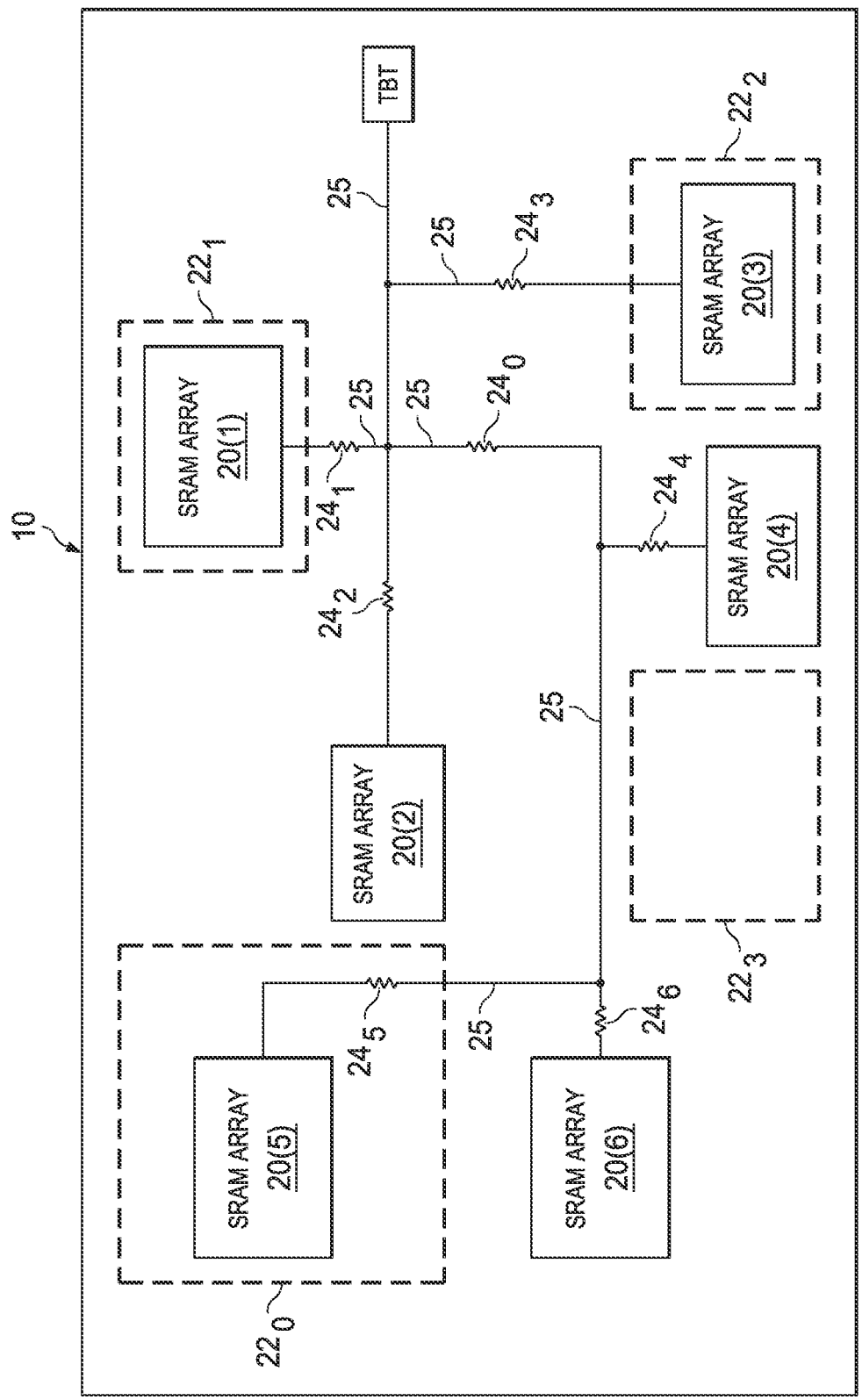
FIG. 3 is a physical layout, in plan view, of the integrated circuit of FIG. 2 illustrating the physical locations of various memory arrays and the routing of test power to those arrays.

FIG. 3 illustrates a generalized layout of large-scale integrated circuit 10 having multiple instances of embedded SRAM arrays 20(1) through 20(6); of course, fewer or more SRAM arrays 20 may be deployed within integrated circuit 10, depending on its overall function and capability. The placement of logic functions or circuits $22_0$ through $22_3$ are shown by dashed lines in FIG. 3, to illustrate that some of SRAM arrays 20 are realized within logic functions 22, and that other SRAM arrays 20 are realized outside of a logic function 22; in addition, logic function $22_3$ does not have its own SRAM array 20, but will generally be in communication with one or more of arrays 20, as appropriate. It is contemplated that SRAM arrays 20(1) through 20(6) will often be placed at locations of integrated circuit 10 near or within logic functions 22 utilizing those SRAM resources.

Figure 1:
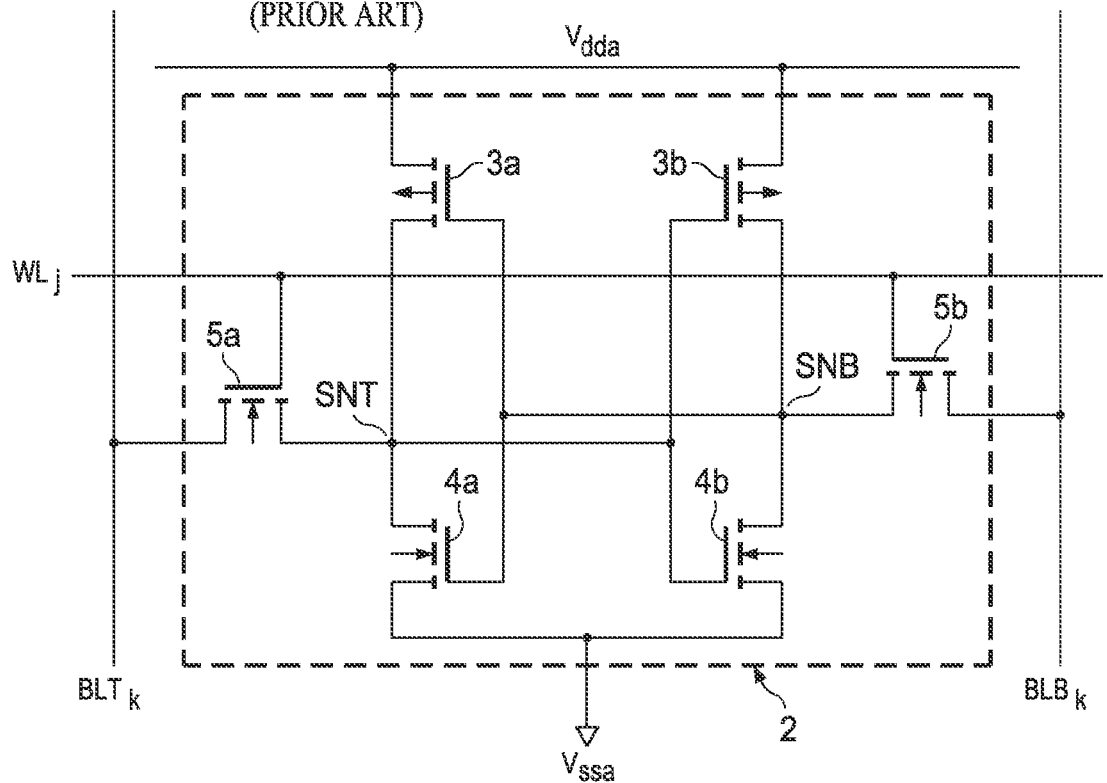
FIG. 1 is an electrical diagram, in schematic form, of a conventional six-transistor static random access memory (SRAM) cell.

It is contemplated that some or all of SRAM arrays 20(1) through 20(6) will include SRAM cells (e.g., a 6-T cell such as SRAM cell 2 described above in connection with FIG. 1) that are of substantially identical construction as one another, in that the transistors of those cells in the various arrays 20 will have features formed of the same material in the same level (e.g., gate electrodes formed in first level polysilicon), and of the same size (e.g., gate width, source/drain junction doping and depth, etc.) as one another. Especially for those arrays 20 having cells of the same construction as one another, but also perhaps in other cases, it is contemplated that some or all of SRAM arrays 20(1) through 20(6) are intended to be biased to a common array power supply voltage.

Figure 4:
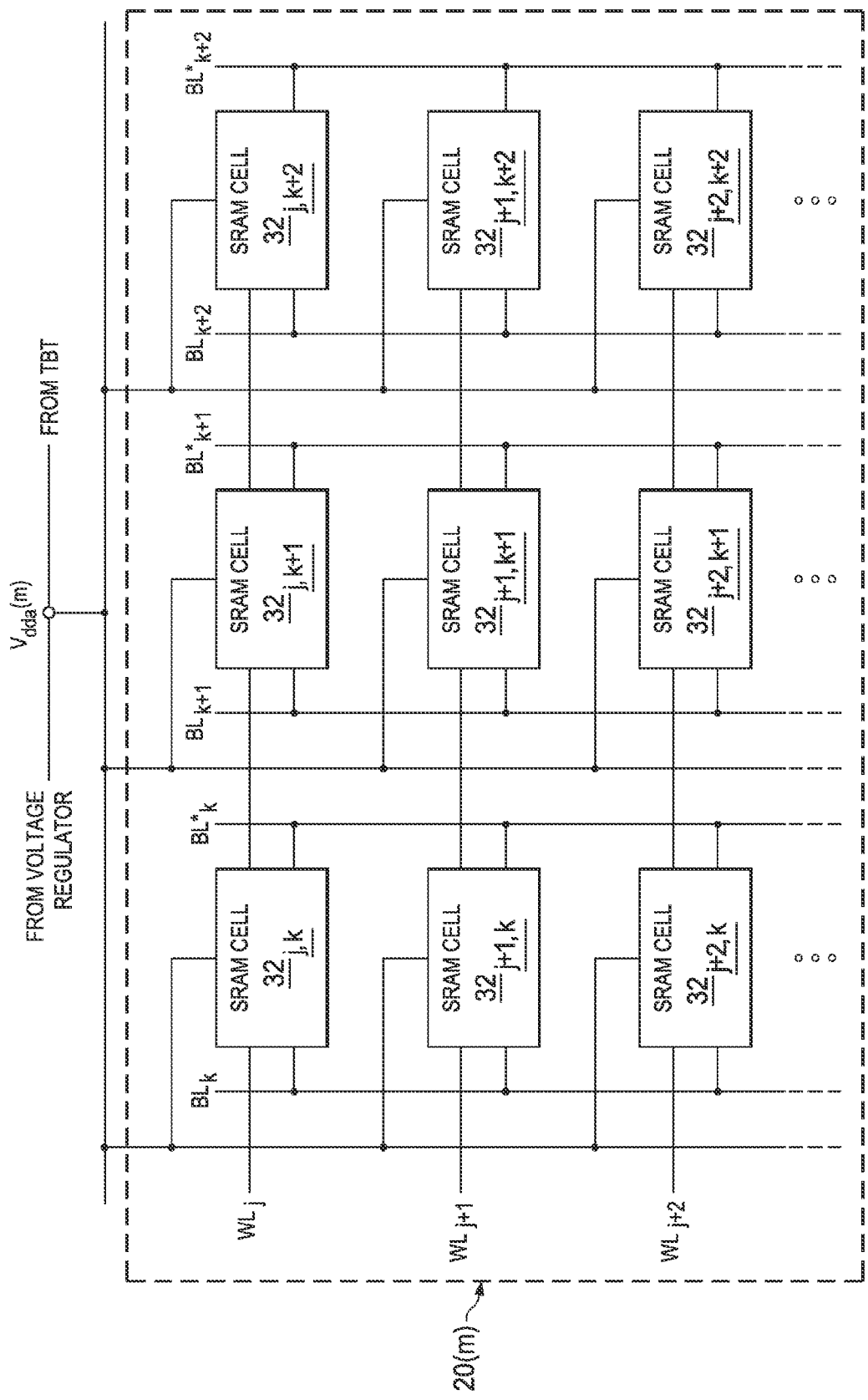
FIG. 4 is an electrical diagram, in block form, illustrating the arrangement of SRAM cells in one of the memory arrays of the integrated circuit of FIGS. 2 and 3.

FIG. 4 schematically illustrates, in a simplified manner, the construction of a portion of a representative SRAM array 20(m), including portions of three rows and three columns of SRAM cells 32. As shown in FIG. 4, SRAM cell $32_{j,k}$ resides in row j of SRAM array 20(m), along with SRAM cells $32_{j,k+1}$, $32_{j,k+2}$, and such other cells 32 in that row. Each of SRAM cells $32_{j,k}$, $32_{j,k+1}$, $32_{j,k+2}$, etc. receive word line $WL_j$ associated with row j; similarly, other rows in array 20(m) are similarly associated with a corresponding word line. SRAM cell 32 also resides in column k of SRAM array 20(m), along with SRAM cells $32_{j+1,k}$, $32_{j+2,k}$, and such other cells 32 in that column. Each of SRAM cells $32_{j,k}$, $32_{j+1,k}$, $32_{j+2,k}$, etc. are associated with differential bit lines $BL_k$, $BL^*_k$ that are associated with column k; similarly, other columns in array 20(m) are similarly associated with a corresponding bit line pair. As described above in connection with the example of conventional cell 2 of FIG. 1, word line $WL_j$, when energized, couples SRAM cell $32_{j,k}$ to bit lines $BL_k$, $BL^*_k$, by way of which data can be read from or written to SRAM cell $32_{j,k}$.

As shown in FIG. 4, each of SRAM cells 32 in array 20(m) are biased from array power supply node $V_{dda}$(m). Similarly, each of SRAM cells 32 are biased to ground, or a power supply voltage $V_{ssa}$ (not shown). In this example, array power supply node $V_{dda}$(m) for SRAM array 20(m) is connected to a voltage regulator (not shown), which provides a bias voltage to SRAM array 20(m), and perhaps also to one or more of other SRAM arrays 20, during normal operation of integrated circuit 10. In many integrated circuits, particularly those in which memory arrays and other circuits receive their power supply bias from a voltage regulator, that voltage regulator inhibits the ability of test equipment to vary the power supply bias applied to those memory arrays and circuits. To provide bias control during testing of integrated circuit 10, therefore, array power supply node $V_{dda}$(m) is also connected to test bias terminal TBT, at which an externally generated bias at the desired level can be applied, for example by automated test equipment. This connection between array power supply node $V_{dda}(m)$ and test bias terminal TBT can be made through a voltage-regulator-bypass power switch (not shown), if desired.

Test bias terminal TBT, in this embodiment of the invention, is a terminal of integrated circuit 10 at which a power supply voltage can be applied from external to integrated circuit 10 during functional test of integrated circuit 10, and specifically during functional test of SRAM arrays 20 within integrated circuit 10. For integrated circuit 10 in packaged form, test bias terminal TBT corresponds to an external pin or surface mount pad. Whether bonded out or not, test bias terminal TBT corresponds also to a probe pad, formed of a top level metal conductive element at the surface of the die containing integrated circuit 10, by way of which a power supply voltage can be applied during functional test of integrated circuit 10 and its SRAM arrays 20 when in wafer form. It is contemplated that test bias terminal TBT will be used primarily in testing integrated circuit 10 when in wafer form, considering that it may not be efficient to dedicate an external package terminal to a test function, especially if a thorough and accurate functional test screen may be performed in wafer form. As shown in FIG. 3, test bias terminal TBT is connected to an array power supply node at each of SRAM arrays 20(1) through 20(6) in this embodiment of the invention, by way of conductors 25.

Functional testing of these large-scale integrated circuits such as integrated circuit 10 will include functional testing of each of embedded SRAM arrays 20, including at "guardband" power supply voltages for identifying and quantifying those SRAM cells 32 that are weak or vulnerable to such effects as NBTI or RTN shifts, or that may not satisfy the electrical specifications for integrated circuit 10 over its entire temperature range (i.e., under a temperature-dependent "guardband" bias). It has been observed, in connection with this invention, that conductors 25 running between this test bias terminal TBT and array power supply nodes $V_{dda}$ at each of embedded SRAM arrays 20 exhibit a resistance that causes an "IR" (product of current and resistance) voltage drop between test bias terminal TBT and each array power supply node $V_{dda}$. This voltage drop is exacerbated by modern manufacturing technologies that form conductors 25 with ever-smaller cross-sectional area, relative to the length of the conductor. While, as mentioned above, it is known to apply a fixed voltage compensation to a bias terminal such as test bias terminal TBT to account for the IR drop in the conductor, this same fixed voltage compensation is conventionally applied for the test of each function or memory array in the integrated circuit. But it has been discovered, according to this invention, that because embedded SRAM arrays 20 are realized at various physical locations in integrated circuit 10, the IR voltage drops between test bias terminal TBT and array power supply nodes $V_{dda}$ can vary significantly among arrays 20, causing the actual power supply voltage at each array 20(m) to vary accordingly.

The schematic illustration of FIG. 3 illustrates the effect of the resistance of conductors 25 by way of parasitic resistors 24. In this example, parasitic resistor $24_1$ corresponds to the parasitic resistance from test bias terminal to SRAM array 20(1), parasitic resistor $24_2$ corresponds to the parasitic resistance from test bias terminal to SRAM array 20(2), and so on. More distant SRAM arrays 20(4), 20(5), 20(6), will have their IR voltage drop determined by the sum of resistances of various lengths of conductor 25; for example, the parasitic resistance between SRAM array 20(6) can be represented by the sum of parasitic resistance $24_0$ (also shared by SRAM arrays 20(5), 20(6)) and parasitic resistance $24_6$. Differences in the parasitic resistance of conductors 25 between test bias terminal TBT and the various arrays 20 can be significant, especially in large integrated circuits 10, causing the voltage at more distant nodes from test bias terminal TBT, such as at SRAM array 20(5), to be noticeably lower than that at SRAM array 20(3), for example, which is much closer to test bias terminal TBT. For example, IR voltage drop differentials exceeding 10 mV have been observed in some modern-day integrated circuits, such a differential being significant for integrated circuits operating with nominal power supply voltages of on the order of 1.0 volt.

It has been observed, in connection with this invention, that this differential in bias voltage can cause inaccurate screening of SRAM arrays 20, particularly in connection with functional tests that are sensitive to array power supply voltage $V_{dda}$. For the example of a functional screening test, the application of a given power supply voltage at test bias terminal TBT of integrated circuit 10 of FIG. 3 would result in different array power supply voltages among SRAM arrays 20(1) through 20(6), depending on the parasitic resistance 24 presented by conductors 25. In that example, distant SRAM arrays 20(5) and 20(6) would tend to be "overtested" (i.e., the actual array power supply voltage at those arrays would be reduced by the IR voltage drop), potentially identifying "false failures", as compared with SRAM array 20(3) realized near to test bias terminal TBT. Depending on the voltage applied to test bias terminal TBT, both "undertesting" (not identifying bad cells as failures) and "overtesting" (falsely identifying good cells as failures) may occur in the same integrated circuit 10. According to embodiments of this invention, the optimum array bias voltage to be applied to test bias terminal TBT, to result in the desired array bias voltage at each individual SRAM array 20(m), is accurately determined in a manner that takes into account differences in parasitic resistances 24 along conductors 25.

Embodiments of this invention are also applicable to implementations in which multiple test bias terminals are present. In such cases, the multiple test bias terminals may all be connected in parallel with one another, or alternatively each test bias terminal may be connected to only a subset of the memory arrays in the integrated circuit. Embodiments of this invention are also applicable to implementations in which one or multiple test bias terminals are also used for functional operation of the integrated circuit. Even in these implementations, variations in the parasitic resistance of conductors between the applicable test bias terminal and individual memory arrays may still be present, and can be addressed by embodiments of this invention. This description will refer to the case in which a single test bias terminal TBT is provided for all SRAM arrays 20 by way of example, without limiting the scope of the invention to that implementation.

Figure 5A:
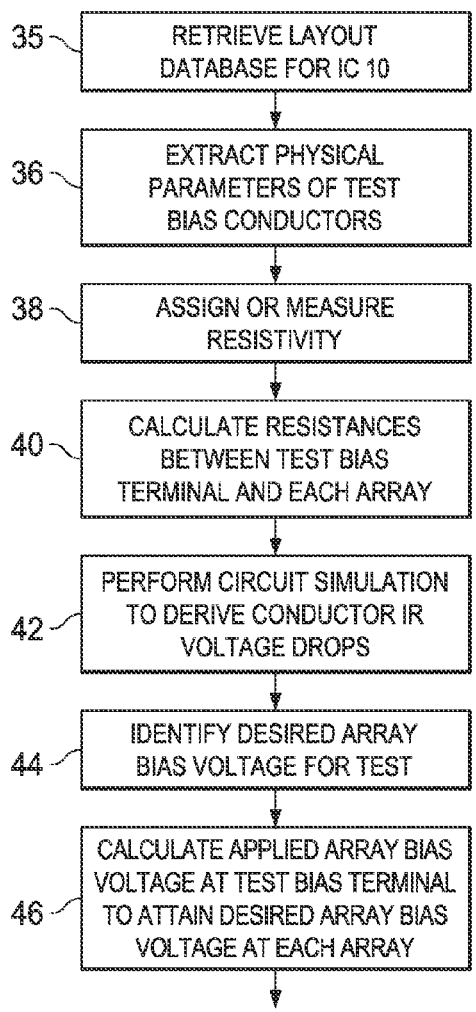
FIG. 5a is a flow diagram illustrating a method of determining voltage drops in the test power conductors to memory arrays in the integrated circuit of FIGS. 2 and 3, according to an embodiment of the invention.

Referring now to FIG. 5a, a method of determining the optimum array bias voltage for each array 20(m) according to an embodiment of this invention will now be described. This embodiment of the invention may be used with existing integrated circuits, as no modification to circuit layout or design is necessitated. It is contemplated that a conventional computer system as used in the design or engineering of modern integrated circuits will be suitable for carrying out all or parts of this method. Such a design computer system may be realized by a single physical computer, such as a conventional workstation or personal computer, or by a computer system implemented in a distributed manner over multiple physical computers, each such computer system executing computer instructions suitable to carry out the functions described in this specification. Such computer instructions may be in the form of one or more executable programs, or in the form of source code or higher-level code from which one or more executable programs are derived, assembled, interpreted or compiled, either as a stand-alone computer program or embedded within a higher-level application, including as a "web" application. It is contemplated that those skilled in the art having reference to this description will be readily able to realize, without undue experimentation, this embodiment of the invention in a suitable manner in such computer systems.

This method begins with process 35, in which the layout database for integrated circuit 10 is retrieved from an appropriate memory resource of a design automation system or the like. As known in the art of modern design automation, the physical implementation of an integrated circuit begins with a "netlist" (i.e., list of gate level interconnections among electrical nodes), standard cells, and other representations, as generated by a logical synthesis tool or process. These representations are then converted into a geometric representation of the physical layout of the integrated circuit, for example by "floorplanning" the layout of the integrated circuit, placing the various circuit blocks into the floorplan, and then routing conductors within and among those circuit blocks. The result of this physical implementation is typically a data file (e.g., a GDS file) from which photomasks can be generated for use in the manufacture of integrated circuits. Process 35 of FIG. 5a thus begins with the retrieval of the appropriate portions of the layout database for integrated circuit 10, particularly those portions pertaining to conductors 25 (FIG. 3).

In process 36, layout-based information necessary to characterize the resistance of conductors 25 running from test bias terminal TBT to each SRAM array 20 are extracted from the retrieved portions of the layout database acquired in process 35, in the form of physical parameters including the lengths of segments of conductors 25, line widths of segments of conductors 25, the conductive material levels in which the segments of conductors 25 are realized (e.g., which level of metal, polysilicon, diffusion), the numbers and types of vias between the conductive material levels of conductors 25 (e.g., for each conductor 25, the number of metal-2 to metal-3 vias, the number of metal-2 to diffusion vias, etc.), and the like. Process 36 also retrieves attributes of the materials used for these segments, for example from another or associated database, those attributes including such information as an identification of the conductive material, the thickness of that material (i.e., layer thickness typically not included in the layout database), etc. In process 38, resistivity values are assigned to each of the conductive materials that realize the various segments of conductors 25. These resistivity values can be retrieved from a database associated with the layout database, or may be measured, or are otherwise assigned to those various conductor materials.

The resistance values of parasitic resistances 24 (FIG. 3) in the layout of integrated circuit 10 are then calculated in process 40. As fundamental in the art, the resistance of a particular segment of a conductor can be calculated as the product of the resistivity of the material of the segment with the ratio of length to cross-sectional area of the segment. A particular parasitic resistance 24 may represent several segments, in which case its value would be the sum of calculated resistances for each sub-segment, plus the resistances calculated for vias between those sub-segments. Some segments (and, in some cases, calculated parasitic resistances 24) may be shared among two or more SRAM arrays 20, as evident from the example of FIG. 3.

In process 42, a circuit simulation is performed to derive an estimate of the voltage drop caused by parasitic resistances 24, between test bias terminal TBT and each of the SRAM arrays 20 under consideration, during the expected test conductions for that SRAM array 20. This simulation may be performed using conventional circuit simulation software packages, including those of the well-known Simulation Program with Integrated Circuit Emphasis ("SPICE") type. In order to determine the expected current conducted into a given SRAM array 20 during such simulation, it is of course useful to simulate the operation of integrated circuit under similar conditions as will be expected during a functional test of that SRAM array 20. This may include simulation of the operation of other SRAM arrays 20, or perhaps a standby or non-operating bias condition at those other SRAM arrays 20, depending on the expected conditions of the test. For example, referring to FIG. 3, current drawn by SRAM array 20(6) during the functional test of SRAM array 20(5) will affect the voltage drop between test bias terminal TBT and SRAM array 20(5). As such, not only the current conducted by SRAM array 20(5) itself during its test, but also other current that may be conducted by other SRAM arrays 20 connected along the same conductor 25, may need to be determined in the simulation. Of course, if these other SRAM arrays 20 along conductor 25 are all disabled so as to not draw any current during the test of a particular SRAM array 20, only the current drawn by the SRAM array 20 under test need be simulated.

In process 44, the desired bias voltage to be applied at array bias node $V_{dda}(m)$ during the functional screening test of each SRAM array 20($m$) is identified. Typically, this desired array bias voltage will be substantially below the nominal power supply voltage, for example to screen or identify those cells unable to meet the desired guardband screen as described above, but may vary from test to test depending on the failure mechanism or vulnerability being screened. This desired bias voltage may also vary among the various SRAM arrays 20 according to the function and construction of the corresponding cells 32 in those arrays 20; conversely, arrays 20 with similarly sized and constructed cells 32 may be tested, for one or more tests, at the same desired bias voltage at their respective array bias nodes $V_{dda}(m)$. In process 46, the voltage drops between test bias terminal TBT and each of SRAM arrays 20, as determined in process 42, are added to the desired bias voltages to arrive at the test bias voltage to be applied at test bias terminal TBT for the functional screening test of each of those SRAM arrays 20. By summing the desired bias voltage with the calculated voltage drops, the compensated externally applied test bias voltage at test bias terminal TBT accounts for variations in the IR voltage drops along conductors 25 due to varying distances of SRAM arrays 20 from test bias terminal TBT.

Figure 5B:
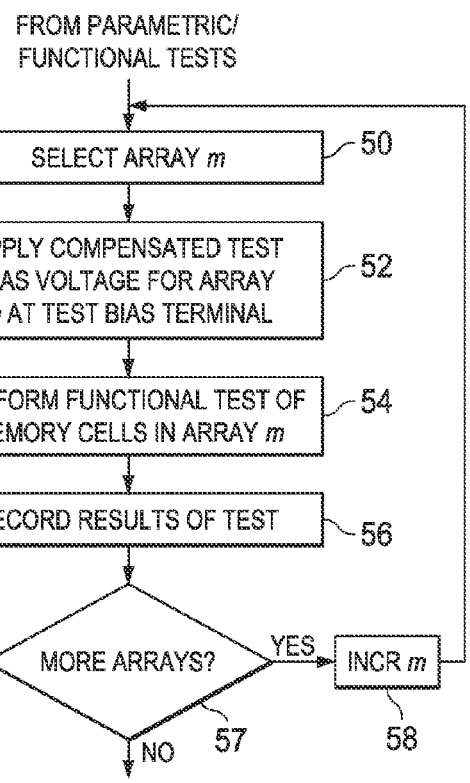
FIG. 5b is a flow diagram illustrating a method of testing memory arrays in the integrated circuit of FIGS. 2 and 3, according to an embodiment of the invention.

FIG. 5b illustrates a generalized method of performing functional tests using the compensated test bias voltages derived in process 46 for the various SRAM arrays 20 of integrated circuit 10. It is contemplated that the test steps illustrated in FIG. 5b and described herein will typically be only part of an overall memory test sequence, the remainder of which will include parametric tests (input and output leakage, DC power dissipation, etc.), and other functional tests (e.g., basic functionality, read and write performance, active power dissipation, etc.). As such, other test operations will typically be performed prior to and after the test sequence shown in FIG. 5b. It is further contemplated that the testing of integrated circuit 10 will typically be performed by automated test equipment, or alternatively by other external bench or other equipment. The test sequence of FIG. 5b may be performed upon integrated circuit 10 in wafer-form, or after packaging.

After performing any desired parametric and general functional tests, one of SRAM arrays 20 is selected for test in process 50. In process 52, the external automated test equipment or other test equipment applies the compensated test bias voltage derived in process 46 to test bias terminal TBT; based on the extraction and simulation described above relative to FIG. 5a, it is contemplated that this applied compensated test bias voltage will result in the desired array bias voltage appearing at array bias node $V_{dda}(m)$ for this selected SRAM array 20(*m*). In process 54, SRAM array 20(*m*) is functionally tested at this desired array bias voltage.

It is contemplated that the nature of the functional test performed in process 54 can vary widely, and can include more than one functional test at this array bias voltage. It is further contemplated that the compensated test bias voltage to test bias terminal TBT may be applied only during portions of a given functional test. For example, one type of test begins with writing known data into SRAM array 20(*m*) under nominal bias, reading out those data under that nominal bias to ensure functionality of SRAM array 20(*m*), and then applying and maintaining the compensated test bias voltage for a selected duration in process 52, resulting in a significantly reduced array bias voltage; the test is then completed by reading SRAM array 20(*m*) under nominal bias to determine whether any data were lost during the time under the reduced array bias. A writeability test may be performed by first applying the reduced array bias voltage of process 52 first and writing data to SRAM array 20(*m*) under that reduced bias, and then raising the bias to nominal levels and to determine whether the write was successful. Yet another test may be carried out by writing data to SRAM array 20(*m*) under nominal bias, followed by performing reads under a reduced array bias as applied via the compensated test bias voltage in process 52, to determine whether the written data were disturbed. It is contemplated that those skilled in the art having reference to this specification will be readily able to derive and implement the desired functional tests under reduced or other bias voltages as determined according to embodiments of this invention.

Following the test or tests of SRAM array 20(*m*) in process 54, the results of those tests are recorded in process 56, for example by storing the addresses of failed cells in memory, or storing a pass/fail indication in memory, in either case associated with the particular instance of integrated circuit 10 and its SRAM array 20(*m*). In decision 57, the automated test equipment determines whether additional SRAM arrays 20 remain to be tested; if so, array index m is incremented (or decremented, or otherwise) in process 58 and the next SRAM array 20(*m*) is selected in process 50 and the process is repeated. Upon completion of the test of the last SRAM array 20(*m*) (decision 57 is "no"), testing of integrated circuit 10 continues according to the test program or sequence.

According to these embodiments of the invention, the voltage applied to a common test bias terminal is adjusted to compensate for IR voltage drops in the conductors between the test bias terminal and the various memory arrays deployed at different locations and distances in the integrated circuit from that terminal. Variations in those conductor lengths and corresponding resistances are thus readily accounted for in determining the external voltage to be applied to the test bias terminal for a particular memory array. As such, accurate functional testing of memory resources in an integrated circuit is accomplished, regardless of the physical location of the particular memory arrays relative to the test bias terminal and without requiring a re-design or re-layout of the overall integrated circuit. Failed and vulnerable memory cells can be thoroughly and accurately identified in memory arrays near to the test bias terminal, without the yield loss due to overtesting at more distant memory arrays.

According to other embodiments of the invention, the direct measurement of the array bias voltage at array bias nodes $V_{dda}(m)$ is enabled, facilitating the application of an accurate compensated test bias voltage to test bias terminal TBT. These embodiments of the invention will now be described in connection with FIGS. 6a and 6b.

Figure 6A:
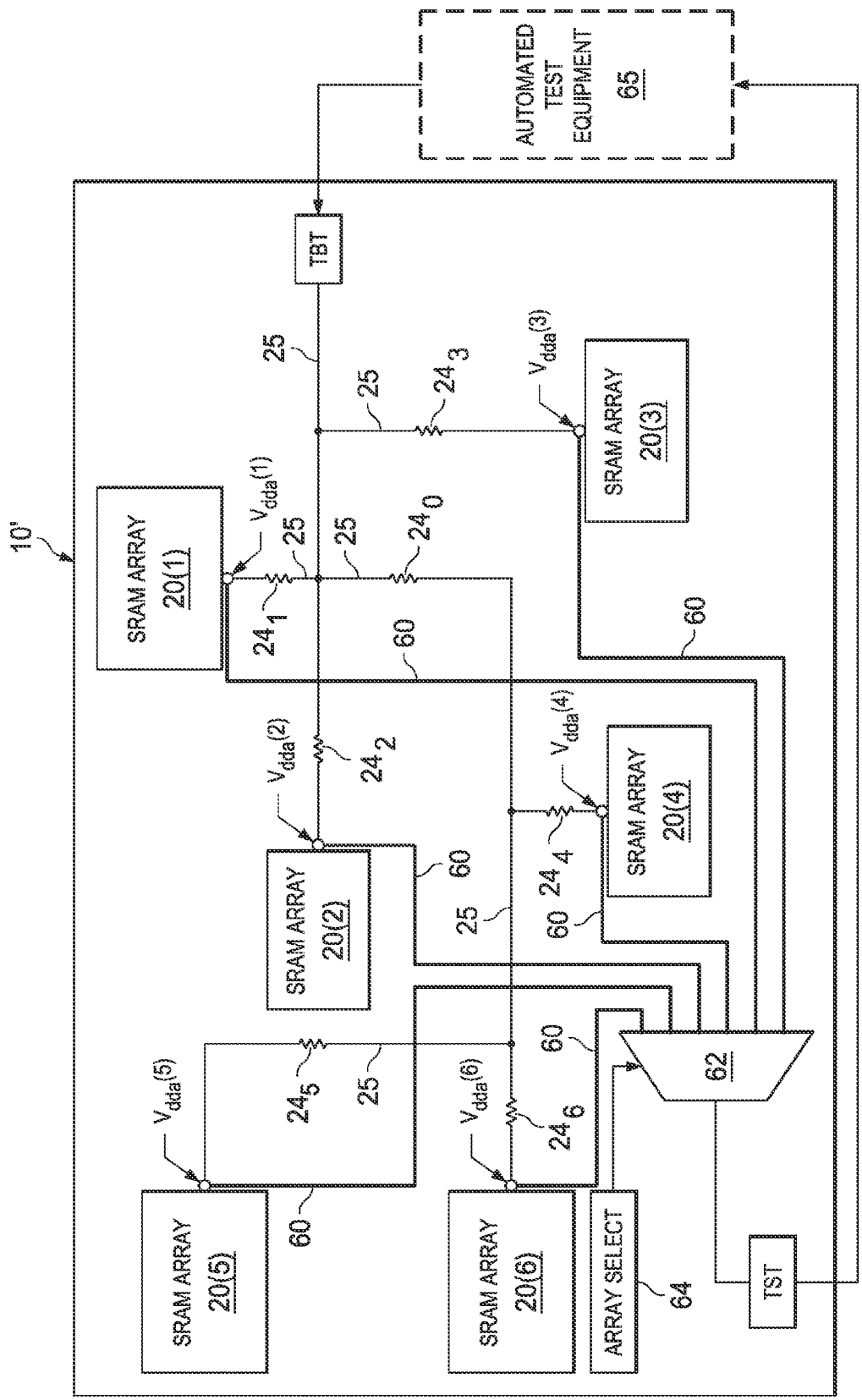
FIGS. 6a and 6b are electrical diagrams, in block form, illustrating the construction of an integrated circuit according to other embodiments of the invention.

FIG. 6a illustrates the generalized layout of large-scale integrated circuit 10', constructed similarly as integrated circuit 10 described above in connection with FIG. 3. As such, integrated circuit 10' includes multiple instances of embedded SRAM arrays 20(1) through 20(6) in the same places as described above. Each SRAM array 20(*m*) is biased from a corresponding array bias node $V_{dda}(m)$, to which test bias terminal TBT is connected by way of conductors 25. And as described above, conductors 25 connecting test bias terminal TBT to array bias nodes $V_{dda}(m)$ have parasitic resistance, shown in the schematic of FIG. 6a by resistances 24.

According to this embodiment of the invention, integrated circuit 10' is constructed to include sense lines 60 connected between each array bias node $V_{dda}(1)$ through $V_{dda}(6)$ and an input of multiplexer 62. Sense lines 60 are formed as conductors in integrated circuit 10', for example by conventional metal lines in the same or different metal levels as conductors 25. Array select circuit 64 presents control signals to select inputs of multiplexer 62 to select one of sense lines 60 for coupling to test sense terminal TST. Test sense terminal TST is a terminal of integrated circuit 10' that is externally accessible, for example accessible to automated test equipment 65 in the example of FIG. 6a. Similarly as test bias terminal TBT, test sense terminal TST may be constructed as a probe pad, formed of a top level metal conductive element at the surface of the die containing integrated circuit 10' and thus accessible during wafer-level test; if bonded out, test sense terminal TST may be an external pin or surface mount pad. Array select circuit 64 may be a dedicated circuit function within integrated circuit 10' that controls the selection of the desired one of SRAM arrays 20 during functional test; alternatively, array select circuit 64 may be incorporated or otherwise a part of a logic function of integrated circuit 10', for example with a special operating mode by way of which program instructions can invoke the selection of one of SRAM arrays 20 to test sense terminal TST via multiplexer 62.

Embodiments of this invention are also applicable to implementations in which multiple test sense terminals, either all connected in parallel with one another or each connected to only a subset of the memory arrays. This description will refer to the case in which a single test sense terminal TST is provided for all SRAM arrays 20 by way of example, without limiting the scope of the invention to that implementation.

Figure 6B:
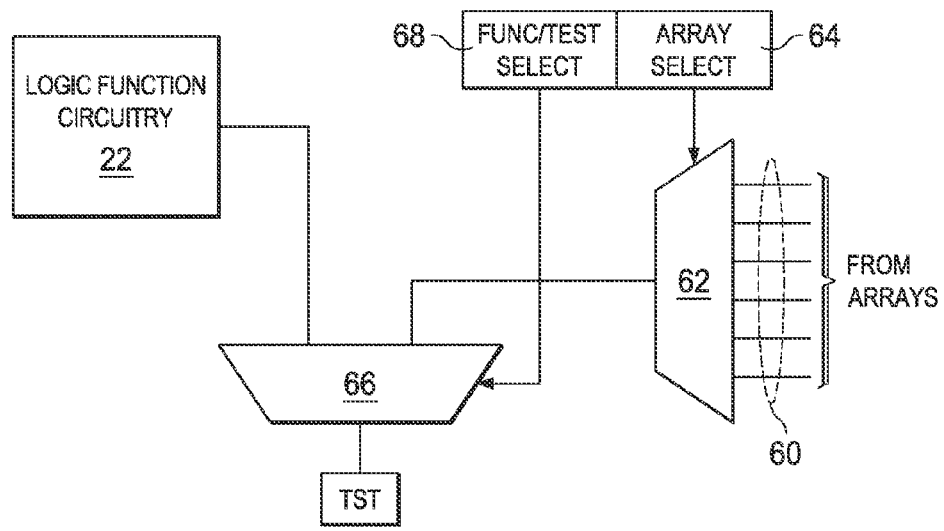

FIG. 6b illustrates an alternative implementation of this embodiment of the invention, in which test sense terminal TST is a dual purpose terminal of integrated circuit 10'. For example, test sense terminal TST may serve as an input, output, clock or control terminal, or other functional input/output terminal during normal operation of integrated circuit 10'. In this implementation, inputs of multiplexer 62 are connected to sense lines 60 from array bias nodes $V_{dda}(m)$, and the select inputs of multiplexer 62 is connected to array select circuit 62, as before. The output of multiplexer 62 is connected to one input of multiplexer 66 in this implementation; the other input of multiplexer 66 is connected to an input or output (as the case may be) of one of logic function circuits 22 in integrated circuit 10', as shown in FIG. 6b. Function/test select circuit 68 has an output connected to the select input of multiplexer 66, and as such controls whether multiplexer 66 connects the output of multiplexer 62 or logic function circuit 22 to test sense terminal TST. Function/test select circuit 68 may be a dedicated circuit function within integrated circuit 10' that indicates the operating mode (test or normal operation) of integrated circuit 10', or may be itself incorporated or otherwise a part of one of the logic functions 22 of integrated circuit 10'. In any case, during normal operation, test sense terminal TST is connected via multiplexer 66 to logic function circuit 22, by way of which it can present or receive the assigned signals according to its function in normal operation. During memory test sequences, test sense terminal TST is connected by multiplexer 66 to the output of multiplexer 62, and thus presents the voltage at the one of SRAM array bias nodes $V_{dda}(m)$ selected by multiplexer 62.

In either case (i.e., the construction of FIG. 6a or the construction of FIG. 6b), test sense terminal TST is enabled during memory test to present the actual voltage at the array bias node $V_{dda}(m)$ for biasing the corresponding SRAM array 20(m) currently under test. It is contemplated that the external sensing by automated test equipment 65, or other external measurement equipment, will present a very high input impedance to test sense terminal TST in order to accurately sense the voltage at that terminal without loading the measurement. As such, it is contemplated that the IR voltage drop presented by sense lines 60 and multiplexer 62 will be insignificant, regardless of the resistance of the corresponding conductors and transistors, and that the voltage at test sense terminal TST will be an accurate measure of the actual bias voltage at the selected SRAM array 20(m).

Figure 7A:
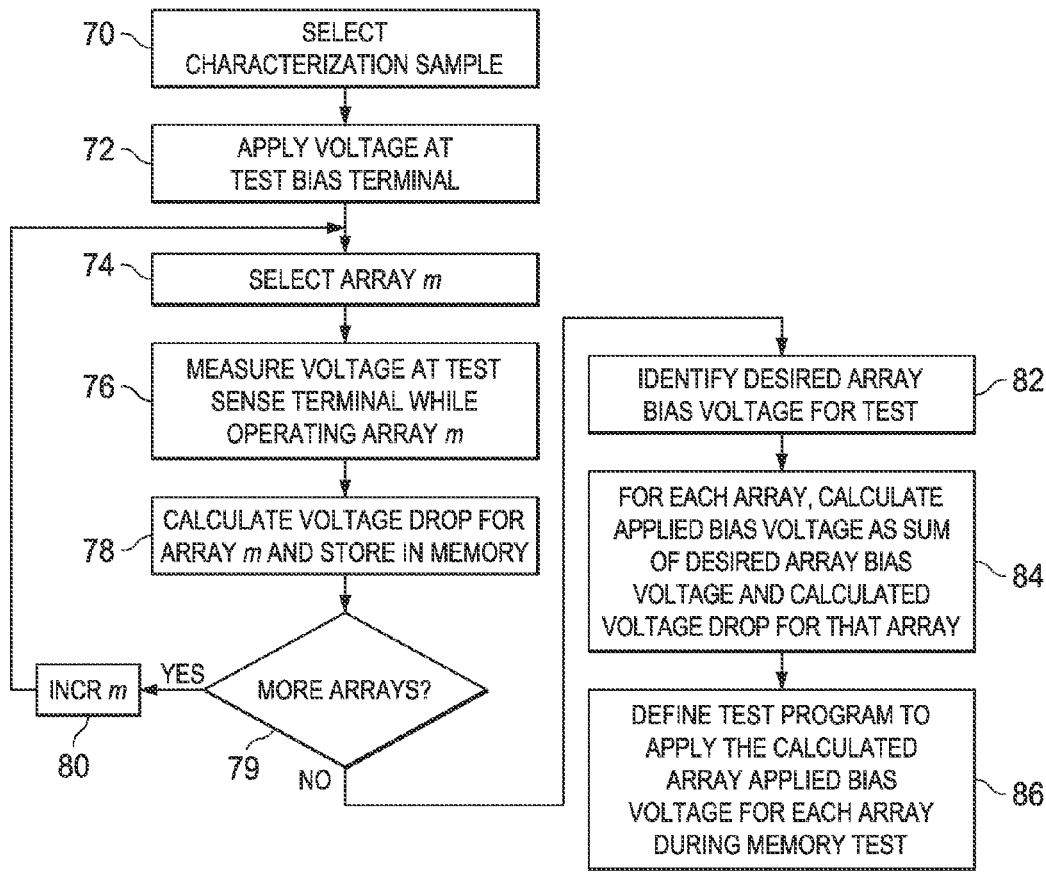
FIGS. 7a and 7b are flow diagrams illustrating a method of determining voltage drops in the test power conductors to memory arrays in the integrated circuit of FIGS. 6a and 6b, according to those embodiments of the invention.

Referring now to FIG. 7a, a method of determining the voltage drops presented by conductors 25 between test bias terminal TBT and SRAM arrays 20 in integrated circuit 10', according to an embodiment of the invention, will now be described. The method shown in FIG. 7a carries out a characterization of these voltage drops, as applied to a single representative sample of integrated circuit 10' or as applied to a sample population of similarly constructed integrated circuits 10' to obtain statistical confidence in the characterization. In either case, the method of FIG. 7a begins with the selection of a characterization sample of integrated circuit 10', in process 70.

In process 72, a voltage is applied to test bias terminal TBT of integrated circuit 10'; this voltage is selected to be representative of array bias voltages to be applied during the functional test of one or more of SRAM arrays 20. In process 74, one of SRAM arrays 20 is selected for characterization; as part of process 74, multiplexer 62 is controlled by array select circuit 64 to connect sense line 60 for that selected SRAM array 20(m) to test sense terminal TST. And in process 76, selected SRAM array 20(m) is functionally tested, during which the voltage at test sense terminal TST is measured by automated test equipment 65 or by other external measurement facilities. The functional test of process 76 is intended to ensure that the current drawn by selected SRAM array 20(m) is similar to that encountered during the actual functional test. However, the actual test conductions applied in process 76 need not necessarily be identical to that of the eventual functional test, but need only cause a similar current draw from the array bias voltage applied via test bias terminal TBT; in some cases, simply the DC bias of selected SRAM array 20(m) may be sufficient to draw such a representative array bias current.

In process 78, the voltage drop between the voltage applied at test bias terminal TBT and the voltage measured at test sense terminal TST, for selected SRAM array 20(m), is calculated, either by automated test equipment 65 or by human personnel. That voltage drop is then stored, typically in the memory of a computer system or automated test equipment 65. Optionally, similar measurement of the voltage drop between test bias terminal TBT and test sense terminal TST may be made at different applied voltages for the same selected SRAM array 20(m) (and particularly if non-linear voltage drops are expected), for example to ensure that the desired voltage will appear at array bias node $V_{dda}(m)$. Upon completion of the measurement for the current selected SRAM array 20(m), decision 79 is then executed to determine whether additional SRAM arrays 20 remain to be measured for the selected characterization sample of integrated circuit 10'. If so (decision 79 is "yes"), array index m is incremented and measurements are obtained by executing processes 74 et seq. for the next selected SRAM array 20(m).

Decision 79 returns a "no" result upon completion of the voltage drop measurement and calculation is complete for all SRAM arrays 20 of the characterization sample (or population, as the case may be). Definition of the test program then begins in process 82, with the definition of the desired voltage that is to appear at each of array bias node $V_{dda}(m)$ for each SRAM array 20(m) during functional test. Again, this particular desired array bias voltage may not be applied for all functional tests; in addition, the desired array bias voltage may vary for different functional tests. In any case, process 82 identifies the desired bias voltage for these tests. In process 84, the bias voltage to be applied to test bias terminal TBT is then calculated, for each SRAM array 20(m) in integrated circuit 10', as the sum of the desired array bias voltage identified in process 82 and the voltage drop calculated in process 78 based on the measured voltage at test sense terminal TST for that SRAM array 20(m). If the calculated voltage drop is based on the characterization of a population of integrated circuits 10', the applied array bias voltage may be determined from the distribution of measured voltages, for example based on a selected statistic. Upon calculating the applied array bias voltage at test bias terminal TBT for each SRAM array 20(m), the test program to be performed by automated test equipment 65 or other equipment is defined in such a way that the calculated applied array bias voltages will appear at test bias terminal TBT, and thus the desired array bias voltages will appear at the selected SRAM arrays 20, during those functional tests.

Upon defining the test program according to this embodiment of the invention, functional test of a population of integrated circuits 10' can then be carried out, for example in the manner described above relative to FIG. 5b. By accounting for variations in the voltage drop of conductors 25 between test bias terminal TBT and SRAM arrays 20 at their various locations within integrated circuit 10', by way of the characterization method of FIG. 7a, it is contemplated that failing and vulnerable memory cells can be accurately identified (i.e., with a reduced number of escapes due to "undertesting"), without significant unnecessary test yield loss due to "overtesting".

According to another embodiment of the invention, the provision of test sense terminal TST enables the real-time measurement of the actual array bias voltage $V_{dda}(m)$ at each SRAM array 20(m) during functional test of that specific instance of integrated circuit 10', and enables the real-time adjustment of the voltage applied to test bias terminal TBT to ensure the proper array bias for each unit under test.

Figure 7B:
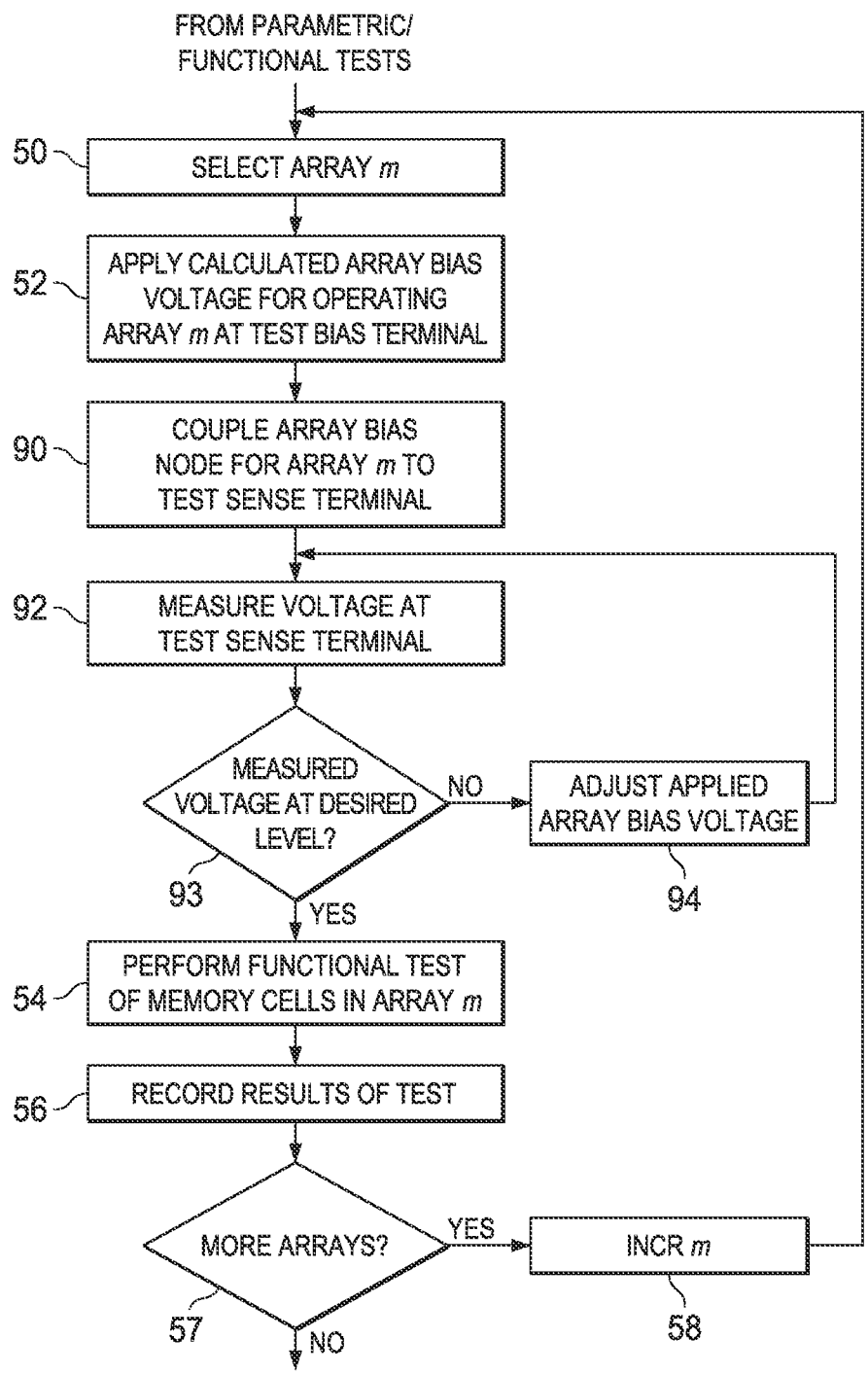

A method of performing this real-time feedback control is illustrated in FIG. 7b, according to this embodiment of the invention. Processes 50 through 57 in performing the functional test of integrated circuit 10' are performed in the manner described above relative to FIG. 5b. The selection of SRAM array 20(m) in process 50 causes the coupling of sense line 60 for its associated array bias node $V_{dda}(m)$ to test sense terminal TST (shown in process 90 of FIG. 7b). Once the corresponding sense line 60 is coupled to test sense terminal TST, and prior to or during the functional test of SRAM array 20(m) (i.e., after the application of an array bias voltage at test bias terminal TBT in process 52 and before or during process 54), automated test equipment 65 measures the voltage at test sense terminal TST in process 92, and in decision 93 determines whether that measured voltage, and thus the array bias voltage at node $V_{dda}(m)$, is at the desired voltage level. If so (decision 93 is "yes"), the test continues with process 54. If not (decision 93 is "no"), the bias voltage applied to test bias terminal TBT is adjusted accordingly in process 94 by automated test equipment 65. The feedback and control loop of measurement process 92, decision 93, and adjustment process 94 are then repeated until the desired array bias voltage is measured at test sense terminal TST (decision 93 is "yes"), following which functional test of the selected SRAM array 20(m) then continues, in process 54.

This real-time measurement and adjustment process can be performed for each SRAM array 20(m) in each integrated circuit 10' that is tested. It is contemplated that the adjustments required within individual integrated circuits 10' will generally be reduced for those SRAM arrays 20 after the first tested, because of the commonality in the construction of conductors 25 within the same device. In addition, it is contemplated that either or both of the simulation and characterization processes described above in connection with FIGS. 5a and 7a may also be performed in advance, such that the array bias voltage first applied at test bias terminal TBT in process 52 will be somewhat close to the eventual adjusted voltage.

Each of the embodiments of the invention described above are contemplated to increase the accuracy with which SRAM arrays are functionally tested for screening purposes in large-scale integrated circuits, regardless of the physical location of those arrays relative to the test bias terminal. As a result of these embodiments of the invention, variations in the parasitic resistance of conductors can be accounted for in setting the applied test voltage, improving the ability to accurately screen failing or vulnerable memory cells, without causing yield loss due to overtesting.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of testing a plurality of memory arrays deployed at separate physical locations in an integrated circuit, comprising:
    determining a voltage drop for each of first and second memory arrays, at first and second locations, respectively, relative to a test bias terminal of the integrated circuit to which each of the first and second memory arrays are directly connected to receive an array bias voltage;
    applying a first array bias voltage at the test bias terminal;
    during the applying step, functionally testing a plurality of memory cells in the first memory array;
    then applying a second array bias voltage at the test bias terminal, the second array bias voltage different from the first array bias voltage by an amount corresponding to a difference in the voltage drops; and
    during the step of applying the second array bias voltage, functionally testing a plurality of memory cells in the second memory array.

2. The method of claim 1, wherein each of the memory arrays comprises a plurality of static random access memory (SRAM) cells arranged in rows and columns.

3. The method of claim 2, wherein the SRAM cells in the first memory array have identical construction as the SRAM cells in the second memory array.

4. The method of claim 1, wherein the functionally testing step comprises, for each of the first and second memory arrays:
    writing data states into a plurality of memory cells in the array;
    reading data states of the plurality of memory cells in the array; and
    comparing the read data states to the written data states.

5. The method of claim 1, wherein the first and second memory arrays are coupled in parallel to the test bias terminal.

6. The method of claim 1, wherein the determining step comprises:
    extracting, from a layout database for the integrated circuit, physical parameters including conductor length and conductor line width for first and second conductors extending between the test bias terminal and each of the first and second memory arrays, respectively;
    calculating a resistance for each of the first and second conductors; and
    performing a simulation of the integrated circuit using the calculated resistances to determine a voltage drop for each of the first and second conductors;
    wherein the first array bias voltage corresponds to a sum of a desired array bias voltage at the array and the voltage drop for the first conductor;
    and wherein the second array bias voltage corresponds to a sum of a desired array bias voltage at the array and the voltage drop for the second conductor.

7. The method of claim 1, wherein the determining step comprises:
    applying a bias voltage to the test bias terminal;
    during the step of applying the bias voltage to the test bias terminal, measuring a voltage at a test sense terminal coupled to the first memory array; and
    during the step of applying the bias voltage to the test bias terminal, measuring a voltage at a test sense terminal coupled to the second memory array.

8. The method of claim 7, wherein the test sense terminal coupled to the first memory array is the same terminal as the test sense terminal coupled to the second memory array; and wherein the determining step further comprises:
    prior to the step of measuring the voltage at the test sense terminal coupled to the first memory array, selectively coupling the first memory array to the test sense terminal; and
    prior to the step of measuring the voltage at the test sense terminal coupled to the second memory array, selectively coupling the second memory array to the test sense terminal.

9. The method of claim 8, wherein the step of measuring a voltage at a test sense terminal coupled to the first memory array is performed during the step of functionally testing a plurality of memory cells in the first memory array;
    and wherein the step of measuring a voltage at a test sense terminal coupled to the second memory array is performed during the step of functionally testing a plurality of memory cells in the second memory array.

10. The method of claim 9, further comprising:
during the step of functionally testing memory cells in the first memory array, adjusting the first array bias voltage responsive to the measuring of the voltage at the test sense terminal coupled to the first memory array; and
during the step of functionally testing memory cells in the second memory array, adjusting the second array bias voltage responsive to the measuring of the voltage at the test sense terminal coupled to the second memory array.

11. The method of claim 10, wherein the adjusting steps adjust the first and second array bias voltages so that the measured voltage at the test sense terminal when coupled to the first memory array is substantially equal to the measured voltage at the test sense terminal when coupled to the second memory array.

12. The method of claim 8, wherein the determining step is performed on a sample of the integrated circuit;
and wherein the steps of applying the first and second array bias voltages, and the steps of functionally testing memory cells in the first and second memory arrays, are performed on a population of integrated circuits different from the sample integrated circuit.

13. An integrated circuit, comprising:
at least one logic function circuit;
a plurality of memory arrays disposed at various physical locations of the integrated circuit;
a test bias terminal directly connected to each of the plurality of memory arrays, for receiving an array bias voltage and coupling that array bias voltage to an array bias node for each of the plurality of memory arrays, each array bias node biasing memory cells in its corresponding memory array;
a test sense terminal;
a plurality of test sense lines, each coupled to the array bias node of one of the plurality of memory arrays;
a first select circuit, coupled to each of the test sense lines and to the test sense terminal, for selecting one of the test sense lines for coupling to the test sense terminal.

14. The integrated circuit of claim 13, wherein each of the memory arrays comprise a plurality of static random access memory (SRAM) cells arranged in rows and columns.

15. The integrated circuit of claim 14, wherein memory cells in a first one of the plurality of memory arrays have identical construction as memory cells in a second one of the plurality of memory arrays.

16. The integrated circuit of claim 13, further comprising:
a second select circuit, coupled between the logic function circuit and the test sense terminal, and coupled between an output of the first select circuit and the test sense terminal, for coupling the test sense terminal to the output of the first select circuit in a test mode, and for coupling the test sense terminal to the logic function circuit in a normal operating mode.

17. The integrated circuit of claim 13, wherein the test sense terminal operates as a functional terminal in the normal operating mode.

* * * * *